(12) United States Patent
Jeong

(10) Patent No.: US 7,555,073 B2
(45) Date of Patent: Jun. 30, 2009

(54) AUTOMATIC FREQUENCY CONTROL LOOP CIRCUIT

(75) Inventor: Minsu Jeong, Gyeonggi-do (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 557 days.

(21) Appl. No.: 11/457,487

(22) Filed: Jul. 14, 2006

(65) Prior Publication Data

US 2007/0025491 A1 Feb. 1, 2007

(30) Foreign Application Priority Data

Jul. 26, 2005 (KR) .................. 10-2005-0067817

(51) Int. Cl.
*H04L 27/06* (2006.01)

(52) U.S. Cl. ............... 375/344; 375/371; 375/373; 375/374; 375/375; 375/376; 327/147; 327/148; 327/149; 327/150; 327/157; 327/158; 327/159

(58) Field of Classification Search .......... 375/344, 375/371–376; 327/147–150, 157–159
See application file for complete search history.

(56) References Cited

U.S. PATENT DOCUMENTS

| 5,038,120 A * | 8/1991 | Wheatley et al. ............. 332/128 |
| 2004/0008805 A1 * | 1/2004 | Xiu et al. ..................... 375/376 |
| 2005/0281367 A1 * | 12/2005 | Lesso ......................... 375/376 |

* cited by examiner

*Primary Examiner*—Curtis B Odom
(74) *Attorney, Agent, or Firm*—Foley & Lardner LLP

(57) ABSTRACT

Provided is a frequency control loop circuit changing division ratios of a frequency synthesizer to oscillate frequencies in a broadband with high precision. The circuit comprises a clock oscillator, a frequency synthesizer, and a demodulator.

15 Claims, 7 Drawing Sheets

US 7,555,073 B2

AUTOMATIC FREQUENCY CONTROL LOOP CIRCUIT

This Nonprovisional application claims priority under 35 U.S.C. § 119(a) on Patent Application No. 10-2005-0067817 filed in Korea on Jul. 26, 2005, the entire contents of which are hereby incorporated by reference.

BACKGROUND OF THE INVENTION

1. Field of the Invention

The present invention relates to a frequency control loop circuit, and more particularly to a frequency control loop circuit which changes division ratios of a frequency synthesizer to oscillate frequencies in a broadband and acquire high precision.

2. Description of the Background Art

In general, RF communication systems use radio frequency (RF) signals of a high frequency band, and they employ a local oscillator (LO) to convert the RF signals of a high frequency band into baseband signals.

There is, however, a difference between a frequency generated from the LO or the RF frequency and a frequency desired by a system. The difference, or error, causes a time information error in the baseband.

In short, if a frequency of received signals is different from a clock sampling frequency or a frequency of a frequency oscillator in data communication or RF communication, it generates time information error and a receiving part cannot process the received signals exactly.

In order to solve such a problem, a receiving part compensates for the time information error by adding a frequency control loop to a frequency generator or a clock sample frequency generator in conventional receiver. The frequency control loop is called an automatic frequency control (AFC) loop. Voltage Controlled Temperature Compensated Crystal Oscillator (VCTCXO) has conventionally used to control frequency and perform compensation.

FIG. 1 shows a conventional frequency synthesizing device to describe a conventional automatic frequency control loop comprising a VCTCXO.

As shown in the drawing, the conventional frequency synthesizing device 100 comprises frequency synthesizers 110a to 110n, demodulators 120a to 120n and VCTCXO 130a to 130n.

A frequency synthesizer 110a outputs an output frequency $F_{OUT1}$ based on an input frequency $F_{IN1}$ and a frequency of the VCTCXO 130a.

A demodulator 120a detects an error in the output frequency $F_{OUT1}$ outputted from the frequency synthesizer 110a and generates a control signal.

The VCTCXO 130a receives the control signal from the demodulator 120a, and feeds the oscillated frequency back to the frequency synthesizer 110a to thereby complete a frequency control loop.

Therefore a conventional automatic frequency control loop uses independent the VCTCXOs 130a to 130n and the frequency is controlled by adjusting a voltage of the VCTCXOs 130a to 130n based on the control signal.

The VCTCXOs 130a to 130n, however, have shortcomings that the production process is complicated and the production cost is high, compared to crystal or a clock generator.

When a single mobile communication terminal comprises a plurality of systems, for example, when the single mobile communication terminal comprises a Code Division Multiple Access (CDMA) system for mobile communication and a Digital Multimedia Broadcasting (DMB) system for a wireless broadcasting service, it should comprise the AFC loops independently from each other according to each receiving mode. Prior to the configuration of the AFC loops, a VCTCXO should be formed for each AFC loop.

In consequences, when the single mobile communication terminal adopts a plurality of systems, there are problems such as large mobile communication terminal, limited housing capacity, high production costs, and low productivity.

SUMMARY OF THE INVENTION

Accordingly, present invention is devised to solve at least the problems and disadvantages of the background art. The present invention has been made in an effort to provide an automatic frequency control (AFC) loop circuit having high precision and oscillating a frequency in a broadband.

To achieve the objects, according to an aspect of the present invention, an AFC loop circuit comprises a clock oscillator for generating a reference frequency, a frequency synthesizer, and a demodulator. The frequency synthesizer comprises a first dividing unit for dividing the reference frequency by a first division ratio and outputting a resultant frequency, a second dividing unit for dividing an oscillation frequency by a second division ratio and outputting a resultant frequency, a phase detecting unit for detecting a phase difference between the output frequency of the first dividing unit and the output frequency of the second dividing unit, a voltage-controlled oscillating unit performing oscillation based on the phase difference detected in the phase detecting unit, and a frequency converting unit for mixing the oscillation frequency of the voltage-controlled oscillating unit with an input frequency to produce an output frequency. The demodulator comprises an error detecting unit for detecting an error frequency by comparing the output frequency of the frequency converting unit with a setup frequency, an integration unit for integrating the error frequency obtained in the error detecting unit in a time domain, and a computing unit for calculating a control quantity based on an integration value obtained in the integration unit. Herein the error of the output frequency is compensated for by changing the division ratio of the first dividing unit or the division ratio of the second dividing unit based on the control quantity of the computing unit.

The first dividing unit or the second dividing unit may be a frictional-N-Phase Locked Loop (PLL), and the first division ratio or the second division ratio may be a real number.

The oscillation frequency may be obtained by multiplying the output frequency of the first dividing unit by an inverse number of the second division ratio.

According to another aspect of the present invention, an AFC loop circuit comprises a clock oscillator for generating a reference frequency, a frequency synthesizer, and a demodulator. The frequency synthesizer comprises a first dividing unit for dividing the reference frequency by a first division ratio and outputting a resultant frequency, a second dividing unit for dividing an oscillation frequency by a second division ratio and outputting a resultant frequency, a phase detecting unit for detecting a phase difference between the output frequency of the first dividing unit and the output frequency of the second dividing unit, a voltage-controlled oscillating unit performing oscillation based on the phase difference detected in the phase detecting unit, a frequency converting unit for mixing the oscillation frequency of the voltage-controlled oscillating unit with an input frequency to produce an output frequency, and a first communication unit receiving a control signal for changing the first division ratio and the second division ratio. The demodulator comprises an error detecting unit for detecting an error frequency by comparing the output frequency of the frequency converting unit with a setup frequency, an integration unit for integrating the error frequency of the error detecting unit in a time domain, a computing unit for calculating a control quantity based on an integration value obtained in the integration unit, and a second communication unit for transmitting the control quantity obtained in the computing unit to the first communication unit. Herein the error of the output frequency is compensated for by changing the division ratio of the first dividing unit or the division ratio of the second dividing unit based on the control quantity obtained in the computing unit.

The first dividing unit or the second dividing unit may be a frictional-N-PLL, and the first division ratio or the second division ratio may be a real number.

The oscillation frequency may be obtained by multiplying the output frequency of the first dividing unit by an inverse number of the second division ratio.

The first and second communication units may use any one method between serial communication and parallel communication.

According to another aspect of the present invention, an AFC loop circuit comprises a clock oscillator for generating a reference frequency, a frequency synthesizer, and a demodulator. The frequency synthesizer comprises a first dividing unit for dividing the reference frequency by a first division ratio and outputting a resultant frequency, a second dividing unit for dividing an oscillation frequency by a second division ratio and outputting a resultant frequency, a phase detecting unit for detecting a phase difference between the output frequency of the first dividing unit and the output frequency of the second dividing unit, a voltage-controlled oscillating unit performing oscillation based on the phase difference detected in the phase detecting unit, a frequency converting unit for mixing the oscillation frequency of the voltage-controlled oscillating unit with an input frequency to produce an output frequency, a first communication unit receiving an error frequency from an error detecting unit, and an integration unit for receiving the error frequency from the first communication unit and integrating the error frequency of the error detecting unit in a time domain. The demodulator comprises the error detecting unit for detecting an error frequency by comparing the output frequency of the frequency converting unit with a setup frequency, and a second communication unit for transmitting the error frequency obtained in the error detecting unit to the first communication unit. Herein the error of the output frequency is compensated for in the integration unit by integrating the error frequency of the error detecting unit in a time domain and changing the first division ratio or the second division ratio based on an integration value.

The first dividing unit or the second dividing it may be a frictional-N-PLL, and the first division ratio or the second division ratio may be a real number.

The oscillation frequency may be obtained by multiplying the output frequency of the first dividing unit by an inverse number of the second division ratio.

The first and second communication units may use any one method between serial communication and parallel communication.

According to another aspect of the present invention, an AFC loop circuit comprises a clock oscillator for generating a reference frequency, a frequency synthesizer, and a demodulator. The frequency synthesizer comprises a first dividing unit for dividing the reference frequency a first division ratio and outputting a resultant frequency, a second dividing unit for dividing an oscillation frequency by a second division ratio and outputting a resultant frequency, a phase detecting unit for detecting a phase difference between the output frequency of the first dividing unit and the output frequency of the second dividing unit, a voltage-controlled oscillating unit performing oscillation based on the phase difference detected in the phase detecting unit, a frequency converting unit for mixing the oscillation frequency of the voltage-controlled oscillating unit with an input frequency to produce an output frequency, and a control unit for changing the first division ratio and the second division ratio. The demodulator comprises the error detecting unit for detecting an error frequency by comparing the output frequency of the frequency converting unit with a setup frequency, and an integration unit for integrating the error frequency of the error detecting unit in a time domain. Herein the error of the output frequency is compensated for in the control unit by changing the first division ratio or the second division ratio based on the integration value obtained in the integration unit.

The first dividing unit or the second dividing unit may be a frictional-N-PLL, and the first division ratio or the second division ratio may be a real number.

The oscillation frequency may be obtained by multiplying the output frequency of the first dividing unit by an inverse number of the second division ratio.

Herein, the control unit may comprise an upper threshold comparing block for comparing the integration value obtained in the integration unit with an upper threshold value, a lower threshold comparing block for comparing the integration value obtained in the integration unit with a lower threshold value, and an up-down counting block for having a count value increased by an output value of the upper threshold comparing block, or decreased by an output value of the lower threshold comparing block. The up-down counting block may increase or decrease the first division ratio or the second division ratio.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
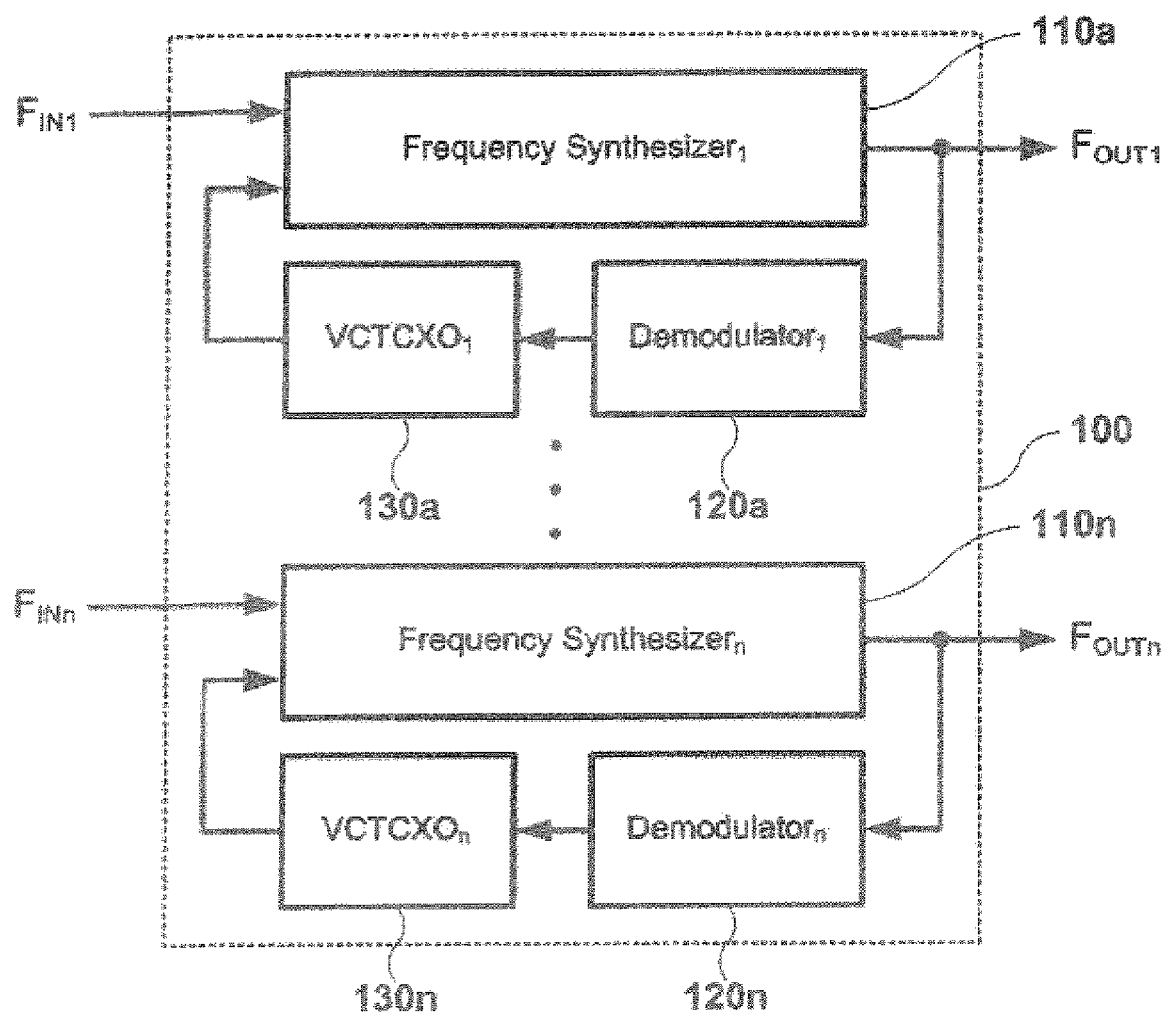
FIG. 1 is a block view illustrating a conventional automatic frequency control loop comprising Voltage Controlled Temperature Compensated Crystal Oscillator (VCTCXO)

Preferred embodiments of the present invention will be described in a more detailed manner with reference to the drawings.

The advantages and features of the present invention will be apparent with reference to the following embodiments and the accompanying drawings. However, the present invention is not limited by the embodiments described hereinafter but it is only illustrated by them. The embodiments are provided to show that the present invention can be realized in diverse forms and to thoroughly describe the scope of the present invention to those skilled in the art of the present invention. The present invention is defined only by the claims. The same reference numerals are used to describe the same constituent elements, even though they appear in different drawings.

Hereinafter, embodiments of the present invention will be described in detail with reference to the accompanying drawings.

Figure 2:
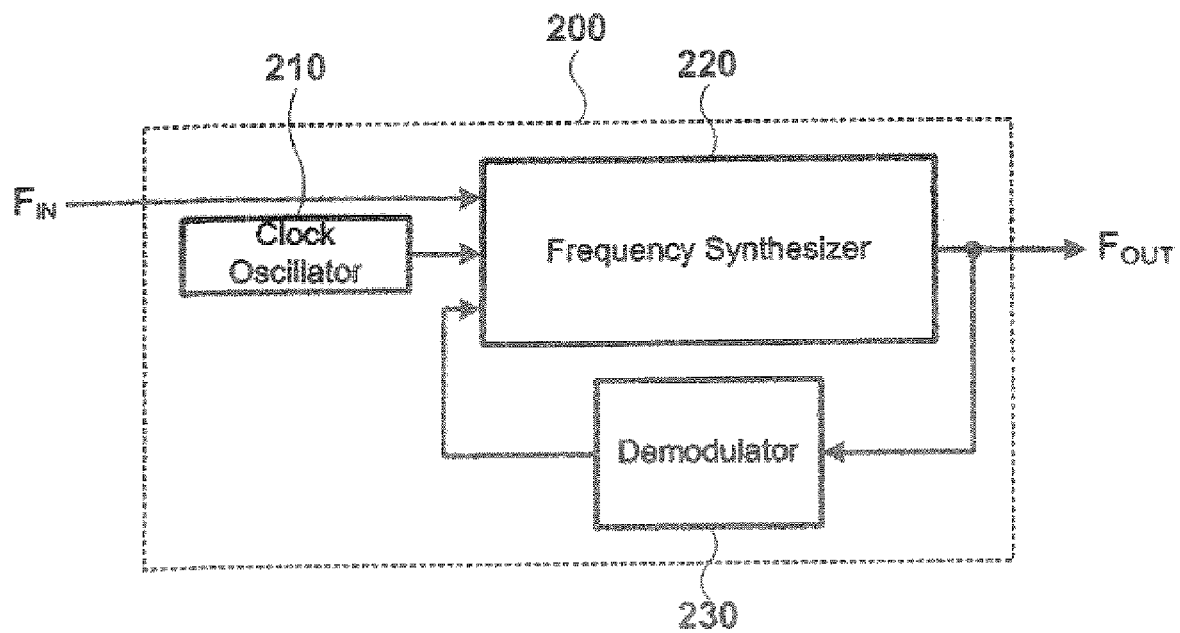
FIG. 2 is a block view showing a receiver that can oscillate a frequency in a broadband according to the present invention.

FIG. 2 is a block view showing a receiver that can oscillate a frequency in a broadband according to the present invention.

As shown in FIG. 2, a frequency synthesizer 200 comprises a clock oscillator 210, a frequency synthesizer 220, and a demodulator 230.

The clock oscillator 210 comprises a device for oscillating a reference frequency.

The frequency synthesizer 220 receives the reference frequency and a control signal for compensating an output frequency $F_{OUT}$.

The demodulator 230 detects an error of the output frequency $F_{OUT}$ and inputs the control signal for compensating for the detected error into the frequency synthesizer 220.

Therefore, it is possible to form a frequency synthesizer 200 that can oscillate a frequency in a broadband by controlling a feedback division ratio in an automatic frequency control (AFC) loop.

First Embodiment

Figure 3:
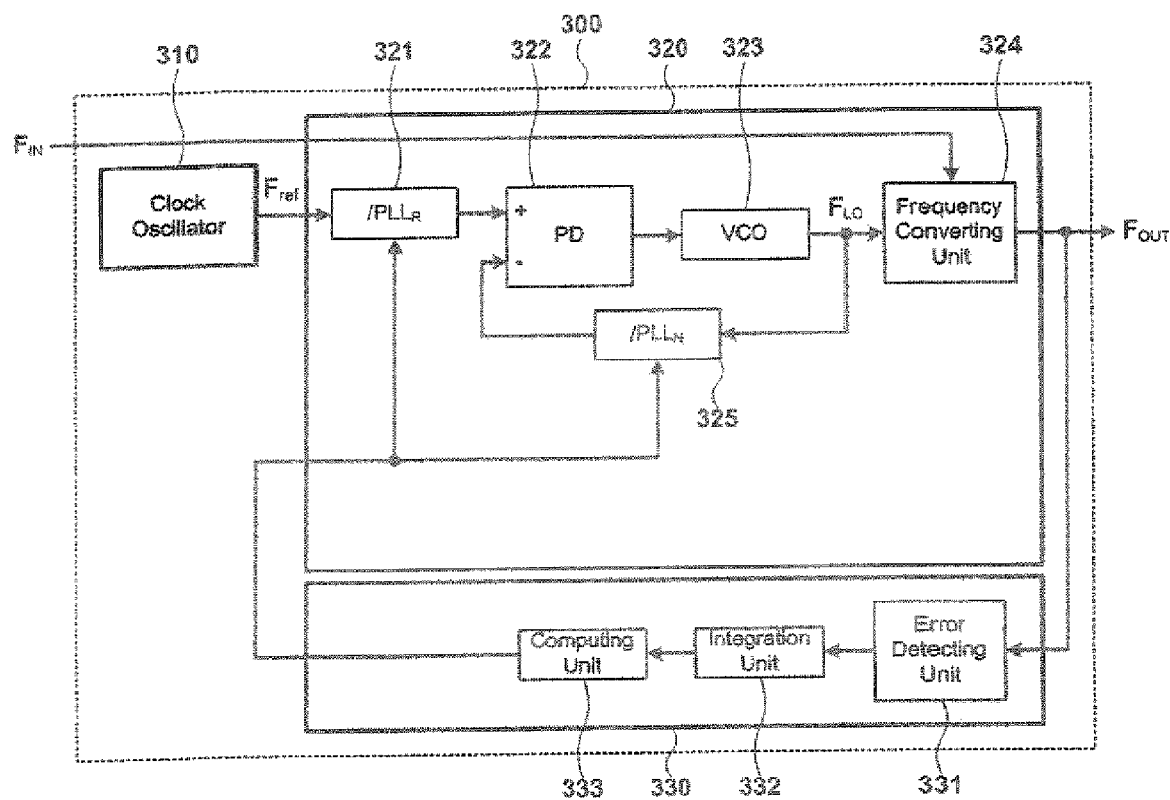
FIG. 3 is a block view illustrating a receiver that can oscillate a frequency in a broadband in accordance with an embodiment of the present invention.

FIG. 3 is a block view illustrating a receiver that can oscillate a frequency in a broadband in accordance with an embodiment of the present invention.

As shown in FIG. 3, the receiver 300 comprises a clock oscillator 310, a frequency synthesizer 320, and a demodulator 330. The clock oscillator 310 comprises a device for oscillating a reference frequency $F_{ref}$. The frequency synthesizer 320 receives the reference frequency $F_{ref}$, an input frequency $F_{IN}$, and a control signal for compensating an output frequency $F_{OUT}$. The demodulator 330 detects error of the output frequency $F_{OUT}$ in the frequency synthesizer 320, and inputs the control signal for compensating for the detected error to the frequency synthesizer 320.

The clock oscillator 310 comprises an oscillation device for oscillating the reference frequency $F_{ref}$. The frequency synthesizer 320 comprises a first dividing unit 321, a second dividing unit 325, a phase detecting unit 322, a voltage-controlled oscillating unit 323, and a frequency converting unit 324. The demodulator 330 comprises an error detecting unit 331, an integration unit 332, and a computing unit 333.

An output terminal of the clock oscillator 310 is connected to an input terminal of the first dividing unit 321. An output terminal of the first dividing unit 321 is connected to a (+) input terminal of the phase detecting unit 322. An output terminal of the phase detecting unit 322 is connected to an input terminal of the voltage-controlled oscillating unit 323. An output terminal of the voltage-controlled oscillating unit 323 is connected to a first input terminal of a frequency converting unit 324 and an input terminal of the second dividing unit 325. An output terminal of the second dividing unit 325 is connected to a (−) input terminal of the phase detecting unit 322. An output terminal of the frequency converting unit 324 is connected to an input terminal of the error detecting unit 331. An output terminal of the error detecting unit 331 is connected to an input terminal of the integration unit 332. An output terminal of the integration unit 332 is connected to an input terminal of the computing unit 333. An output terminal of the computing unit 333 is connected to a control terminal of the first dividing unit 321 and a control terminal of the second dividing unit 325. An input frequency $F_{IN}$ is inputted to the frequency converting unit 324 through a second input terminal. An output frequency $F_{OUT}$ is outputted from the output terminal of the frequency converting unit 324.

The clock oscillator 310 oscillates the reference frequency $F_{ref}$ and provides the oscillated reference frequency to the frequency synthesizer 320.

The first dividing unit 321 multiplies the oscillated reference frequency $F_{ref}$ by a first division ratio $1/PLL_R$ ($1/PLL_R*F_{ref}$) and supplies the result to the (+) input terminal of the phase detecting unit 322. Herein, when the first dividing unit 321 is formed, the first division ratio ($1/PLL_R$) may be brought into a range of real numbers by using a factional-N-Phase Locked Loop (PLL).

The phase detecting unit 322 detects a phase difference between an output frequency ($1/PLL_R*F_{ref}$) of the first dividing unit 321 supplied to the (+) input terminal and an output frequency ($1/PLL_N*F_{LO}$) of the second dividing unit 325 supplied to the (−) input terminal, and supplies the detected phase difference to the input terminal of the voltage-controlled oscillating unit (VCO) 323.

The voltage-controlled oscillating unit 323 oscillates an oscillation frequency $F_{LO}$ upon receipt of the phase difference detected in the phase detecting unit 322, and supplies the oscillation frequency $F_{LO}$ to the input terminal of the second dividing unit 325 and the input terminal of the frequency converting unit 324. Herein, the oscillation frequency $F_{LO}$ is obtained by multiplying the output frequency ($1/PLL_R*F_{ref}$) of the first dividing unit 321 by an inverse number of the second division ratio $1/PLL_N$ ($F_{LO}=PLL_N*F_{ref}/PLL_R$).

The second dividing unit 325 multiplies the oscillation frequency $F_{LO}$ by the second division ratio $1/PLL_N$ ($1/PLL_N*F_{LO}$) and supplies the result to the (−) input terminal of the phase detecting unit 322. Herein, when the second dividing unit 325 is formed, the second division ratio $1/PLL_N$ may be brought into a range of real numbers by using a fractional-N-PLL.

The frequency converting unit 324 outputs an output frequency $F_{OUT}$ by mixing the oscillation frequency $F_{LO}$ of the voltage-controlled oscillating unit 323 with the input frequency $F_{IN}$, and supplies the output frequency $F_{OUT}$ to the input terminal of the error detecting unit 331.

The error detecting unit 331 calculates an error frequency by comparing the output frequency $F_{OUT}$ with the setup frequency and supplies the obtained error frequency to the integration unit 332.

The integration unit 332 integrates the error frequency of the error detecting unit 331 in a time domain and supplies the integration result to the computing unit 333.

The computing unit 333 calculates a control quantity by using the size of the error frequency integrated in the integration unit 332 and changes the first division ratio and the second division ratio based on the control quantity.

Therefore, when the first division ratio $1/PLL_R$ and the second division ratio $1/PLL_N$ are changed, the output frequency $F_{OUT}$ is compensated by changing the reference frequency $F_{ref}$.

Second Embodiment

Figure 4:
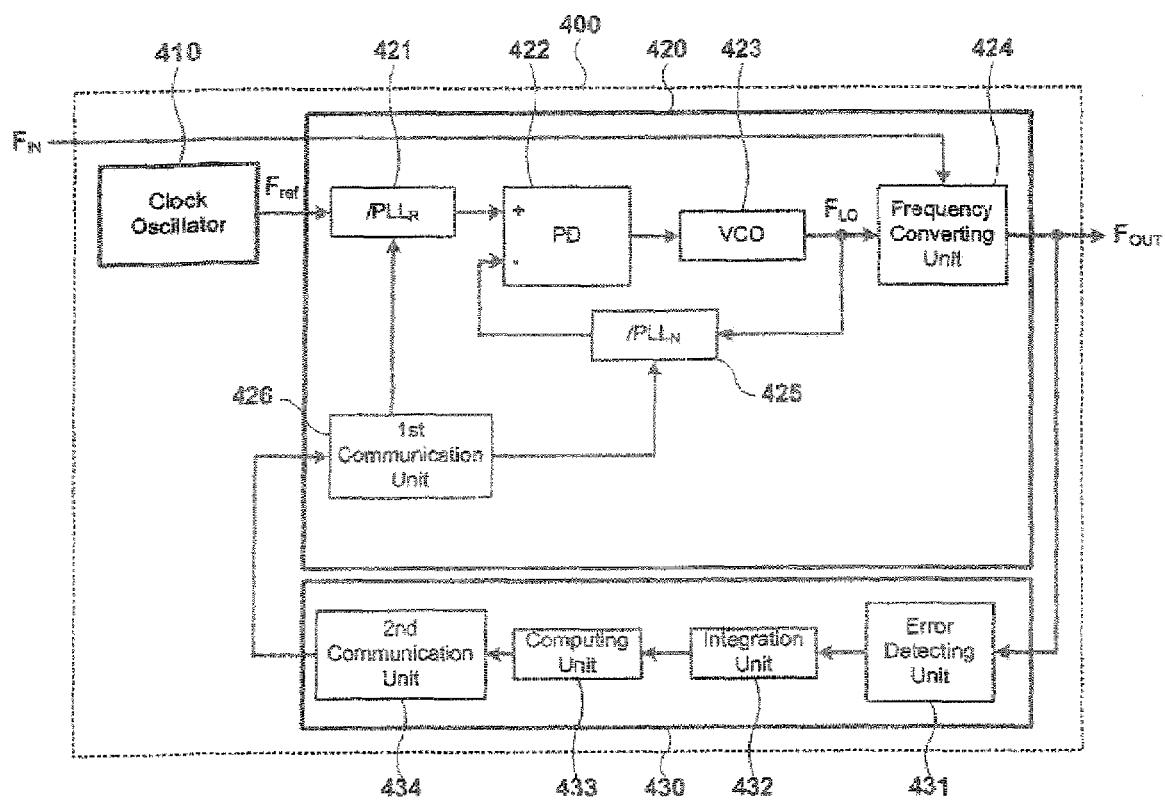
FIG. 4 is a block view describing a receiver that can oscillate a frequency in a broadband in accordance with another embodiment of the present invention.

FIG. 4 is a block view describing a receiver that can oscillate a frequency in a broadband in accordance with another embodiment of the present invention.

As illustrated in FIG. 4, the receiver 400 comprises a clock oscillator 410, a frequency synthesizer 420, and a demodulator 430. The clock oscillator 410 comprises a device for oscillating a reference frequency $F_{ref}$. The frequency synthesizer 420 receives the reference frequency $F_{ref}$, an input frequency $F_{IN}$, and a control signal for compensating an output frequency $F_{OUT}$. The demodulator 430 detects an error of the output frequency $F_{OUT}$ oscillated in the frequency synthesizer 420, and inputs a control signal for compensating for the detected error to the frequency synthesizer 420.

The clock oscillator 410 comprises a device for oscillating a reference frequency $F_{ref}$. The frequency synthesizer 420 comprises a first dividing unit 421, a second dividing unit 425, a phase detecting unit 422, a voltage-controlled oscillating unit 423, a frequency converting unit 424, and a first communication unit 426. The demodulator 430 comprises an error detecting unit 431, an integration unit 432, a computing unit 433, and second communication unit 434.

An output terminal of the clock oscillator 410 is connected to an input terminal of the first dividing unit 421. An output terminal of the first dividing unit 421 is connected to a (+) input terminal of the phase detecting unit 422. An output terminal of the phase detecting unit 422 is connected to an input terminal of the voltage-controlled oscillating unit 423. An output terminal of the voltage-controlled oscillating unit 423 is connected to a first input terminal of the frequency converting unit 424 and an input terminal of the second dividing unit 425. An output terminal of the second dividing unit 425 is connected to a (−) input terminal of the phase detecting unit 422. An output terminal of the frequency converting unit 424 is connected to an input terminal of the error detecting unit 431.

An output terminal of the error detecting unit 431 is connected to an input terminal of the integration unit 432. An output terminal of the integration unit 432 is connected to an input terminal of the computing unit 433. An output terminal of the computing unit 433 is connected to an input terminal of the second communication unit 434. An output terminal of the second communication unit 434 is connected to an input terminal of the first communication unit 426. An output terminal of the first communication unit 426 is connected to a control terminal of the first dividing unit 421 and a control terminal of the second dividing unit 425.

The input frequency $F_{IN}$ is inputted to the frequency converting unit 424 through a second input terminal and the output frequency $F_{OUT}$ is outputted from the output terminal of the frequency converting unit 424.

The clock oscillator 410 oscillates a reference frequency $F_{ref}$ and provides the oscillated reference frequency to the frequency synthesizer 420.

The first dividing unit 421 multiplies the reference frequency $F_{ref}$ by a first division ratio $1/PLL_R$ and supplies the result $(1/PLL_R * F_{ref})$ to the (+) input terminal of the phase detecting unit 422. Herein, when the first dividing unit 421 is formed, the first division ratio $(1/PLL_R)$ may be brought into a range of real numbers by using a fractional-N-PLL.

The phase detecting unit 422 detects a phase difference between an output frequency $(1/PLL_R * F_{ref})$ of the first dividing unit 421 supplied to the (+) input terminal and an output frequency $(1/PLL_N * F_{LO})$ of the second dividing unit 425 supplied to the (−) input terminal, and supplies the detected phase difference to the input terminal of the voltage-controlled oscillating unit 423.

The voltage-controlled oscillating unit 423 oscillates an oscillation frequency $F_{LO}$ upon receipt of the phase difference detected in the phase detecting unit 422, and supplies the oscillation frequency $F_{LO}$ to the input terminal of the second dividing unit 425 and the input terminal of the frequency converting unit 424. Herein, the oscillation frequency $F_{LO}$ is obtained by multiplying the output frequency $(1/PLL_R * F_{ref})$ of the first dividing unit 421 by an inverse number of the second division ratio $1/PLL_N (F_{LO} = PLL_N * F_{ref}/PLL_R)$.

The second dividing unit 425 multiplies the oscillation frequency $F_{LO}$ by the second division ratio $1/PLL_N$ and supplies the result $(1/PLL_N * F_{LO})$ to the (−) input terminal of the phase detecting unit 422. Herein, when the second dividing unit 425 is formed, the second division ratio $1/PLL_N$ may bee brought into a range of real numbers by using a fractional-N-PLL.

The frequency converting unit 424 outputs an output frequency $F_{OUT}$ by mixing the oscillation frequency $F_{LO}$ of the voltage-controlled oscillating unit 423 with the input frequency $F_{IN}$, and supplies the output frequency $F_{OUT}$ to the input terminal of the error detecting unit 431.

The first communication unit 426 receives a control signal for changing the first division ratio $1/PLL_R$ and the second division ratio $1/PLL_N$ from the second communication unit 434.

The error detecting unit 431 calculates an error frequency by comparing the output frequency $F_{OUT}$ with a setup frequency and supplies the obtained error frequency to the integration unit 432.

The integration unit 432 integrates the error frequency of the error detecting unit 431 in a time domain and supplies the integration result to the computing unit 433.

The computing unit 433 calculates a control quantity for changing the first and the second division ratios by using the size of the error frequency integrated in the integration unit 432, and transmits the calculation result to the first communication unit 426 through the second communication unit 436. Herein, the first and second communication units 426 and 434 use any one method between serial communication and a parallel communication.

When the first division ratio $1/PLL_R$ and the second division ratio $1/PLL_N$ are changed in this structure, the error of the output frequency $F_{OUT}$ is compensated for by changing the reference frequency $F_{ref}$.

Third Embodiment

Figure 5:
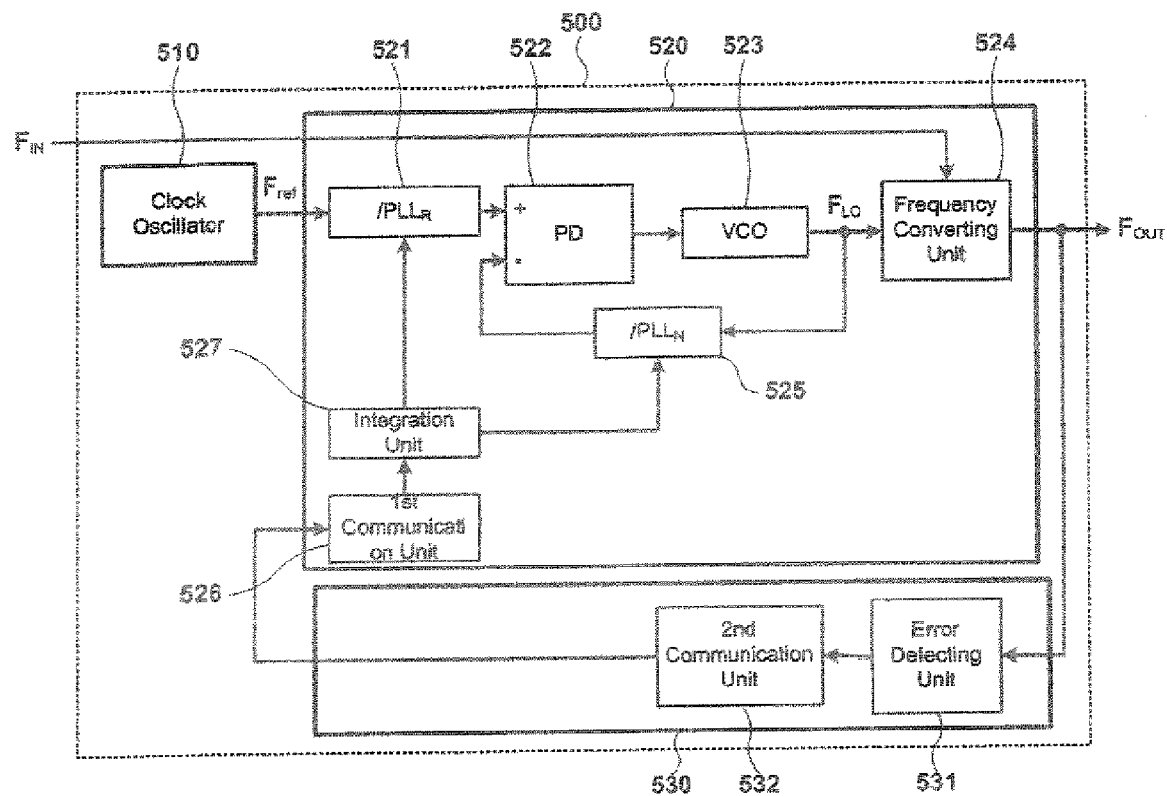
FIG. 5 is a block view showing a receiver that can oscillate a frequency in a broadband in accordance with yet another embodiment of the present invention.

FIG. 5 is a block view showing a receiver that can oscillate a frequency in a broadband in accordance with yet another embodiment of the present invention.

As illustrated in FIG. 5, the receiver 500 comprises a clock oscillator 510, a frequency synthesizer 520, and a demodulator 530. The clock oscillator 510 comprises a device for oscillating a reference frequency $F_{ref}$. The frequency synthesizer 520 receives the reference frequency $F_{ref}$, an input frequency $F_{IN}$, and a control signal for compensating an output frequency $F_{OUT}$. The demodulator 530 detects an error of the output frequency $F_{OUT}$ in the frequency synthesizer 520, and inputs the control signal for compensating for the detected error to the frequency synthesizer 520.

The clock oscillator 510 comprises a device for oscillating a reference frequency $F_{ref}$. The frequency synthesizer 520 comprises a first dividing unit 521, a second dividing unit 525, a phase detecting unit 522, a voltage controlled oscillating unit 523, a frequency converting unit 524, and a first communication unit 526, and an integration unit 527. The demodulator 530 comprises an error detecting unit 531 and second communication unit 532.

An output terminal of the clock oscillator 510 is connected to an input terminal of the first dividing unit 521. An output terminal of the first dividing unit 521 is connected to a (+) input terminal of the phase detecting unit 522. An output terminal of the phase detecting unit 522 is connected to an input terminal of the voltage-controlled oscillating unit 523. An output terminal of the voltage-controlled oscillating unit 523 is connected to a first input terminal of the frequency converting unit 524 ad input terminal of the second dividing unit 525. An output terminal of the second dividing unit 525 is connected to a (−) input terminal of the phase detecting unit 522. An output terminal of the first communication unit 526 is connected to an output terminal of the integration unit 527. An output terminal of the integration unit 527 is connected to a control terminal of the first dividing unit 521 and a control terminal of the second dividing unit 525. An output terminal of the frequency converting unit 524 is connected to an input terminal of the error detecting unit 531. An output terminal of the error detecting unit 531 is connected to an input terminal of the second communication unit 532. An output terminal of the second communication unit 532 is connected to an input terminal of the first communication unit 526.

The input frequency $F_{IN}$ is inputted to the frequency converting unit 524 through a second input terminal and the output frequency $F_{OUT}$ is outputted from the output terminal of the frequency converting unit 524.

The clock oscillator 510 oscillates a reference frequency $F_{ref}$ and provides the oscillated reference frequency to the frequency synthesizer 520.

The first dividing unit 521 multiplies the reference frequency $F_{ref}$ by a first division ratio $1/PLL_R$ and supplies the result $(1/PLL_R * F_{ref})$ to the (+) input terminal of the phase detecting unit 522. Herein, when the first dividing unit 521 is formed, the first division ratio $1/PLL_R$ may be brought into a range of real numbers by using a fractional-N-PLL.

The phase detecting unit 522 detects a phase difference between an output frequency $(1/PLL_R * F_{ref})$ of the first dividing unit 521 supplied to the (+) input terminal and an output frequency $(1/PLL_N * F_{LO})$ of the second dividing unit 525 supplied to the (−) input terminal, and supplies the detected phase difference to the input terminal of the voltage-controlled oscillating unit 523.

The voltage-controlled oscillating unit 523 oscillates an oscillation frequency $(F_{LO})$ upon receipt of the phase difference detected in the phase detecting unit 522, and supplies the oscillation frequency $F_{LO}$ to the input terminal of the second dividing unit 525 and the input terminal of the frequency converting unit 524. Herein, the oscillation frequency $F_{LO}$ is obtained by multiplying the output frequency $(1/PLL_R * F_{ref})$ of the first dividing unit 521 by an inverse number of the second division ratio $(1/PLL_N)$ $(F_{LO} = PLL_N * F_{ref}/PLL_R)$.

The second dividing unit 525 multiplies the oscillation frequency $F_{LO}$ by the second division ratio $1/PLL_N$ $(1/PLL_N * F_{LO})$ and supplies the result to the (−) input terminal of the phase detecting unit 522. Herein, when the second dividing unit 525 is formed, the second division ratio $1/PLL_N$ may be brought into a range of real numbers by using a fractional-N-PLL.

The frequency converting unit 524 outputs an output frequency $F_{OUT}$ by mixing the oscillation frequency $F_{LO}$ of the voltage-controlled oscillating unit 523 with the input frequency $F_{IN}$, and supplies the output frequency $F_{OUT}$ to the input terminal of the error detecting unit 531.

The first communication unit 526 receives a calculation result of the error detecting unit 531 for changing the first division ratio $1/PLL_R$ and the second division ratio $1/PLL_N$ from the second communication unit 532.

The integration unit 527 integrates the calculation result of the error detecting unit 531 in a time domain by using the first communication unit 526 and changes the first division ratio $1/PLL_R$ and the second division ratio $1/PLL_N$ based on the integration result.

The error detecting unit 531 calculates an error by comparing the output frequency $F_{OUT}$ and a setup frequency, and supplies the obtained error to the second communication unit 532.

The second communication unit 532 transmits the calculation result of the error detecting unit 531 to the first communication unit 526. Herein, first and second communication units 526 and 532 use any one method between serial communication and a parallel communication.

When the first division ratio $1/PLL_R$ and the second division ratio $1/PLL_N$ are changed in this structure, the error of the output frequency $F_{OUT}$ is compensated for by changing the reference frequency $F_{ref}$.

Forth Embodiment

Figure 6:
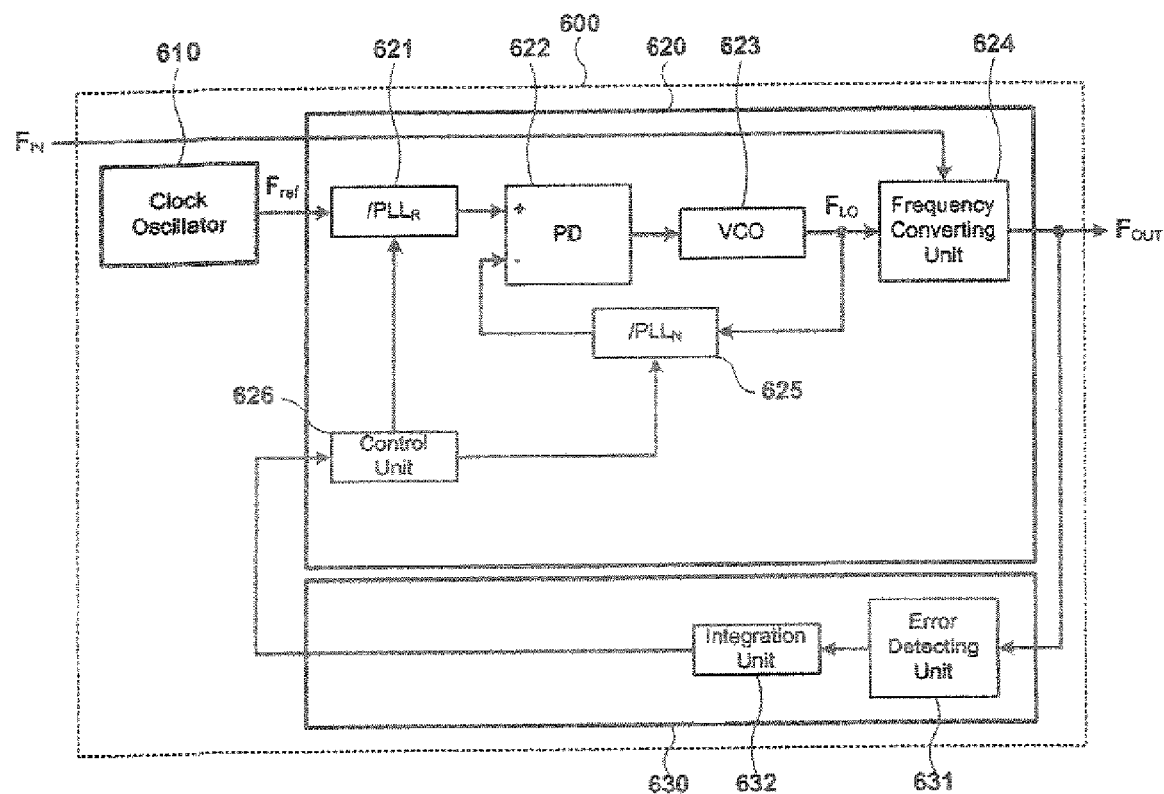
FIG. 6 is a block view illustrating a receiver that can oscillate a frequency in a broadband in accordance with still another embodiment of the present invention.

FIG. 6 is a block view illustrating a receiver that can oscillate a frequency in a broadband in accordance with still another embodiment of the present invention.

As illustrated in FIG. 6, the receiver 600 comprises a clock oscillator 610, a frequency synthesizer 620, and a demodulator 630. The clock oscillator 610 comprises a device for oscillating a reference frequency $F_{ref}$. The frequency synthesizer 620 receives the reference frequency $F_{ref}$, an input frequency $F_{IN}$, and a control signal for compensating an output frequency $F_{OUT}$. The demodulator 630 detects an error of the output frequency $F_{OUT}$ in the frequency synthesizer 620, and inputs the control signal for compensating for the detected error to the frequency synthesizer 620.

The clock oscillator 610 comprises a device for oscillating a reference frequency $F_{ref}$. The frequency synthesizer 620 comprises a first dividing unit 624 a second dividing unit 625, a phase detecting unit 622, a voltage-controlled oscillating unit 623, a frequency converting unit 624, and a control unit 626. The demodulator 630 comprises an error detecting unit 631 and an integration unit 632.

A output terminal of the clock oscillator 610 is connected to an input terminal of the first dividing unit 621. An output terminal of the first dividing unit 621 is connected to a (+) input terminal of the phase detecting unit 622. An output terminal of the phase detecting unit 622 is connected to input terminal of the voltage-controlled oscillating unit 623. An output terminal of the voltage-controlled oscillating unit 623 is connected to a first input terminal of the frequency converting unit 624 and input terminal of the second dividing unit 625. An output terminal of the second dividing unit 625 is connected to a (−) input terminal of the phase detecting unit 622. An output terminal of the frequency converting unit 624 is connected to an input terminal of the error detecting unit 631. An output terminal of the control unit 626 is connected to a control terminal of the first dividing unit 621 and a control terminal of the second dividing unit 625. An output terminal of the error detecting unit 631 is connected to an input terminal of the integration unit 632. An output terminal of the integration unit 632 is connected to an input terminal of the control unit 626.

The input frequency $F_{IN}$ is inputted to the frequency converting unit 624 through a second input terminal and the output frequency $F_{OUT}$ is outputted from the output terminal of the frequency converting unit 624.

The clock oscillator 610 oscillates a reference frequency $F_{ref}$ and provides it to the frequency synthesizer 620.

The first dividing unit 621 multiplies the reference frequency $F_{ref}$ by a first division ratio $1/PLL_R$ and supplies the result ($1/PLL_R*F_{ref}$) to the (+) input terminal of the phase detecting unit 622. Herein, when the first dividing unit 621 is formed, the first division ratio ($1/PLL_R$) may be brought into a range of real numbers by using a factional-N-PLL The phase detecting unit 622 detects a phase difference between an output frequency ($1/PLL_R*F_{ref}$) of the first dividing unit 621 supplied to the (+) input terminal and an output frequency ($1/PLL_N*F_{LO}$) of the second dividing unit 625 supplied to the (−) input terminal, and supplies the detected phase difference to the input terminal of the voltage-controlled oscillating unit 623.

The voltage-controlled oscillating unit 623 oscillates an oscillation frequency $F_{LO}$ upon receipt of the phase difference detected in the phase detecting unit 622, and supplies the oscillation frequency $F_{LO}$ to the input terminal of the second dividing unit 625 and the input terminal of the frequency converting unit 624. Herein, the oscillation frequency $F_{LO}$ is obtained by multiplying the output frequency ($1/PLL_R*F_{ref}$) of the first dividing unit 621 by an inverse number of the second division ratio $1/PLL_N$ ($F_{LO}=PLL_N*F_{ref}/PLL_R$).

The second dividing unit 625 multiplies the oscillation frequency $F_{LO}$ by the second division ratio $1/PLL_N$ and supplies the result ($1/PLL_N*F_{LO}$) to the (−) input terminal of the phase detecting unit 622. Herein, when the second dividing unit 625 is formed, the second division ratio $1/PLL_N$ may be brought into a range of real numbers by using a fractional-N-PLL.

The frequency converting unit 624 outputs an output frequency $F_{OUT}$ by mixing the oscillation frequency $F_{LO}$ of the voltage-controlled oscillating unit 623 with the input frequency $F_{IN}$, and supplies the output frequency $F_{OUT}$ to the input terminal of the error detecting unit 631.

The control unit 626 changes the first division ratio $1/PLL_R$ and the second division ratio $1/PLL_N$ based on the integration result obtained in the integration unit 632.

The error detecting unit 631 calculates an error frequency by comparing the output frequency $F_{OUT}$ with the input frequency and supplies the obtained error frequency to the integration unit 632.

The integration unit 632 integrates the calculation result of the error detecting unit 631 in a time domain and transmits the integration result to the control unit 626.

When the first division ratio $1/PLL_R$ and the second division ratio $1/PLL_N$ are changed in this structure, the error of the output frequency $F_{OUT}$ is compensated for by changing the reference frequency $F_{ref}$.

As described with reference to FIGS. 3 TO 6, the present invention changes the first and second division ratios by using one clock oscillator and oscillates frequencies required by a Code Division Multiple Access (CDMA) system and a Digital Multimedia Broadcasting (DMB) system which is different from the conventional technology where a plurality of VCTCXOs are used to operate a CDMA system and a DMB system.

Figure 7:
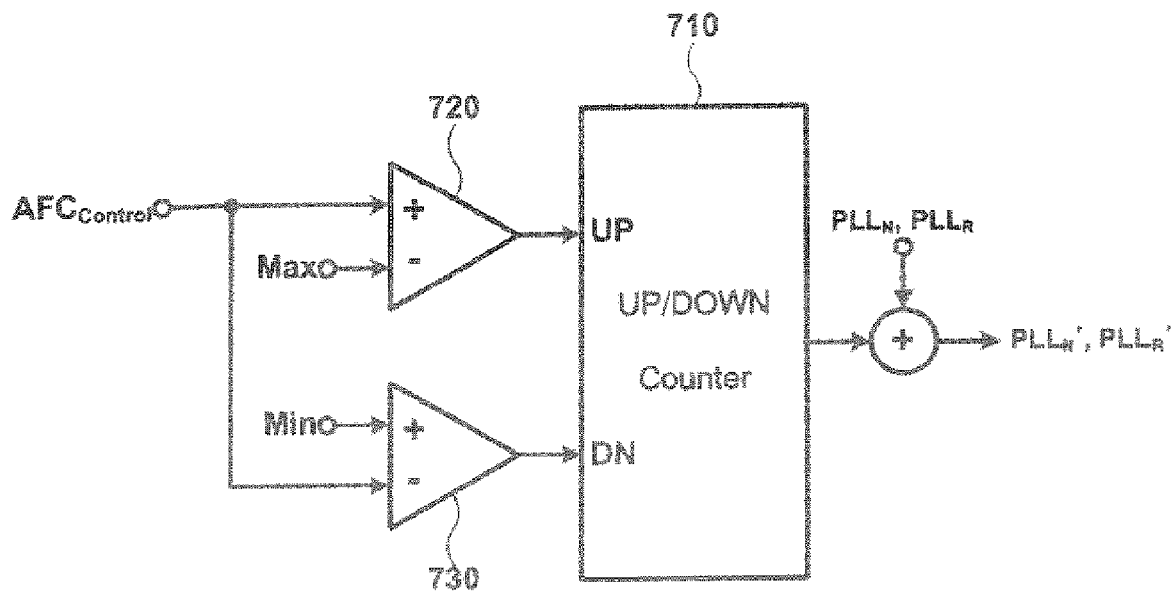
FIG. 7 is block view describing a controller of FIG. 6.

FIG. 7 is block view describing the control unit of FIG. 6. The control unit includes an upper threshold comparing block 720 and a lower threshold comparing block 730, and an up-down counting block 710.

An AFC control value is inputted to a (+) terminal of the upper threshold comparing block 720 and a (−) terminal of the lower threshold comparing block 730 to be compared with an upper threshold value and a lower threshold value therein. A maximum threshold value is supplied to a (−) terminal of the upper threshold comparing block 720 and a minimum threshold value is supplied to a (+) terminal of the lower threshold comparing block 730.

When the AFC control value supplied to the (+) terminal of the upper threshold comparing block 720 is larger than the upper threshold value, an up-counter pulse signal (UP) is generated in the upper threshold comparing block 720. When the AFC control value supplied to the (−) terminal of the lower threshold comparing block 730 is smaller than the lower threshold value, a down-counter pulse signal (DN) is generated in the lower threshold comparing block 730.

An output terminal of the upper threshold comparing block 720 is connected to an up terminal of the up-down counting block 710, and output terminal of the lower threshold comparing block 730 is connected to a down terminal of the up-down counting block 710.

Therefore, when the up-counter pulse signal (UP) is generated in the upper threshold comparing block 720, the up-counter pulse signal (UP) is supplied to the up terminal of the up-down counting block 710 to adjust an output signal upward in the up-down counting block 710. When the down-counter pulse signal (DN) is generated in the lower threshold comparing block 730, the down-counter pulse signal (DN) is supplied to the down terminal of the up-down counting block 710 to adjust an output signal downward in the up-down counting block 710.

The output signal increases or decreases the existing first and second division ratios $PLL_N$ and $PLL_R$ to change them into a third division ratio $PLL_N'$ and a fourth division ratio $PLL_R'$ in the output terminal of the up-down counting block 710.

Herein, voltage can be applied to the demodulator in an inverse polarity. It is obvious to those skilled in the art of the present invention that when an inverse polarity is applied, the polarities of the upper and lower threshold values are reversed.

The automatic frequency control loop circuit of the present invention can acquire high precision and oscillate frequencies in a broadband.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

what is claimed is:

1. An automatic frequency control loop circuit, comprising;
    a clock oscillator generating a reference frequency;
    a frequency synthesizer which comprises:
        a first dividing unit dividing the reference frequency by a first division ratio;
        a second dividing unit dividing an oscillation frequency by a second division ratio;
        a phase detecting unit detecting a phase difference between a first divided frequency of the first dividing unit and a second divided frequency of the second dividing unit;

a voltage-controlled oscillating unit generating the oscillation frequency based on the phase difference; and a frequency converting unit producing an output frequency based on the oscillation frequency and an input frequency; and a demodulator which comprises:
an error detecting unit detecting an error by comparing the output frequency with a setup frequency;
an integration unit integrating the error; and
a computing unit calculating a control signal based on an integration value obtained in the integration unit,
wherein the error is compensated for by changing the first division ratio or the second division ratio based on the control signal.

2. The automatic frequency control loop circuit as claimed in claim 1, wherein the first dividing unit or the second dividing unit is a frictional-N-Phase Locked Loop (PLL), and the first division ratio or the second division ratio is a real number.

3. The automatic frequency control loop circuit as claimed in claim 1, wherein the oscillation frequency is obtained by multiplying the first divided frequency by an inverse number of the second division ratio.

4. An automatic frequency control loop circuit, comprising:
a clock oscillator generating a reference frequency;
a frequency synthesizer which comprises:
a first dividing unit dividing the reference frequency by a first division ratio;
a second dividing unit dividing an oscillation frequency by a second division ratio;
a phase detecting unit detecting a phase difference between the first divided frequency of the first dividing unit and the second divided frequency of the second dividing unit;
a voltage-controlled oscillating unit generating the oscillation frequency based on the phase difference;
a frequency converting unit producing an output frequency based on the oscillation frequency and an input frequency; and
a first communication unit receiving a control signal; and
a demodulator which comprises:
an error detecting unit detecting an error by comparing the output frequency with a setup frequency;
an integration unit integrating the error;
a computing unit calculating a control signal based on an integration value obtained in the integration unit; and
a second communication unit transmitting the control signal to the first communication unit,
wherein the error is compensated for by changing the first division ratio or the second division ratio based on the control signal.

5. The automatic frequency control loop circuit as claimed in claim 4, wherein the first dividing unit or the second dividing unit is a frictional-N-PLL, and the first division ratio or the second division ratio is a real number.

6. The automatic frequency control loop circuit as claimed in claim 4, wherein the oscillation frequency is obtained by multiplying the first divided frequency by an inverse number of the second division ratio.

7. The automatic frequency control loop circuit as claimed in claim 4, wherein the first and second communication units use any one method between serial communication and parallel communication.

8. A automatic frequency control loop circuit, comprising:
a clock oscillator generating a reference frequency;
a frequency synthesizer which comprises:
a first dividing unit dividing the reference frequency by a first division ratio;
a second dividing unit dividing an oscillation frequency by a second division ratio;
a phase detecting unit detecting a phase difference between a first divided frequency of the first dividing unit and a second divided frequency of the second dividing unit;
a voltage-controlled oscillating unit generating the oscillation frequency based on the phase difference;
a frequency converting unit producing an output frequency based on the oscillation frequency and an input frequency;
a first communication unit receiving an error signal; and
an integration unit integrating the error signal; and
a demodulator which comprises:
the error detecting unit detecting an error by comparing the output frequency with a setup frequency and outputting the error signal; and
a second communication unit transmitting the error signal to the first communication unit,
wherein the error is compensated for in the control unit by changing the first division ratio or the second division ratio based on an integrated error of the integration unit.

9. The automatic frequency control loop circuit as claimed in claim 8, wherein the first dividing unit or the second dividing unit is a frictional-N-PLL, and the first division ratio or the second division ratio is a real number.

10. The automatic frequency control loop circuit as claimed in claim 8, wherein the oscillation frequency is obtained by multiplying the first divided frequency by an inverse number of the second division ratio.

11. The automatic frequency control loop circuit as claimed in claim 8, wherein the first and second communication units use any one method between serial communication and parallel communication.

12. A automatic frequency control loop circuit, comprising:
a clock oscillator generating a reference frequency;
a frequency synthesizer which comprises:
a first dividing unit dividing the reference frequency by a first division ratio;
a second dividing unit dividing an oscillation frequency by a second division ratio;
a phase detecting unit detecting a phase difference between a first divided frequency of the first dividing unit and a second divided frequency of the second dividing unit;
a voltage-controlled oscillating unit generating the oscillation frequency based on the phase difference;
a frequency converting unit producing an output frequency based on the oscillation frequency and an input frequency; and
a control unit changing the first division ratio and the second division ratio; and
a demodulator which comprises:
the error detecting unit detecting an error by comparing the output frequency with a setup frequency; and
an integration unit integrating the error,
wherein the error is compensated for in the control unit by changing the first division ratio or the second division ratio based on an integrated error obtained in the integration unit.

13. The automatic frequency control loop circuit as claimed in claim 12, wherein the first dividing unit or the second dividing unit is a frictional-N-PLL, and the first division ratio or the second division ratio is a real number.

14. The automatic frequency control loop circuit as claimed in claim 12, wherein the oscillation frequency is obtained by multiplying the first divided frequency by an inverse number of the second division ratio.

15. The automatic frequency control loop circuit as claimed in claim 12, wherein the control unit comprises:
   upper threshold comparing block comparing the integrated error with an upper threshold value;
   a lower threshold comparing block comparing the integrated error with a lower threshold value; and
   an up-down counting block having a count value increased by an output value of the upper threshold comparing block, or decreased by an output value of the lower threshold comparing block,
   wherein the up-down counting block increases or decreases the first division ratio or the second division ratio.

* * * * *